United States Patent [19]

Okuyama et al.

[11] Patent Number: 4,835,597
[45] Date of Patent: May 30, 1989

[54] SEMICONDUCTOR DEVICE HAVING IMPROVED MULTI-LAYER STRUCTURE OF INSULATING FILM AND CONDUCTIVE FILM

[75] Inventors: Yasushi Okuyama; Manzoh Saitoh, both of Tokyo, Japan

[73] Assignee: NEC Corporation, Tokyo, Japan

[21] Appl. No.: 110,024

[22] Filed: Oct. 15, 1987

Related U.S. Application Data

[63] Continuation of Ser. No. 714,803, Mar. 27, 1985, abandoned.

[30] Foreign Application Priority Data

Mar. 23, 1984 [JP]  Japan .................................. 59-55615

[51] Int. Cl.⁴ ............................................ H01L 29/34
[52] U.S. Cl. .................................. 357/52; 357/23.1; 357/49; 357/59; 357/73
[58] Field of Search .................... 357/23.1, 49, 52, 59, 357/73

[56] References Cited

U.S. PATENT DOCUMENTS

| | | | |
|---|---|---|---|
| 3,784,424 | 1/1974 | Chang | 357/73 |
| 4,079,504 | 3/1978 | Kosa | 357/73 |
| 4,271,582 | 6/1981 | Shirai et al. | 357/73 |

OTHER PUBLICATIONS

RCA Review, vol. 43, No. 3, Sep., 1982, pp. 423–457, Kern et al.

Primary Examiner—Edward J. Wojciechowicz
Attorney, Agent, or Firm—Burns, Doane, Swecker & Mathis

[57] ABSTRACT

A semiconductor device comprises a semiconductor substrate, an insulating film formed on a major surface of the substrate a lower wiring layer formed on the insulating film, a borophosphosilicate glass film covering the lower wiring layer and the insulating film, a phosphosilicate glass film having a low phosphorus concentration and provided on the borophosphosilicate glass film, and a polycrystalline silicon layer doped with an impurity and provided on the phosphosilicate glass. According to the structure, the polycrystalline silicon layer maintains the normal state. Therefore, the silicon layer can be precisely etched for patterning and a wiring layer made of the silicon layer is never moved in a following process step such as thermal step. Further, even if another wiring layer of aluminum is formed on the phosphosilicate glass film, the aluminum wiring layer is not broken above the corner of the lower wiring layer, and is hardly corroded by invaded water into a plastic package.

6 Claims, 3 Drawing Sheets

SEMICONDUCTOR DEVICE HAVING IMPROVED MULTI-LAYER STRUCTURE OF INSULATING FILM AND CONDUCTIVE FILM

The application is a continuation of application Ser. No. 714,803 filed Mar. 22, 1985 now abandoned.

BACKGROUND OF THE INVENTION

The present invention relates to a semiconductor device having a multi-layer structure composed of insulating films and at least a conductive film provided on a semiconductor substrate.

A semiconductor device is manufactured through a sequence of process steps such as impurity diffusion step, oxidation step, chemical vapour deposition step, photolithography step, etching step, and so on. Through these process steps, multi-layer structures of conductive films such as wirings or electrodes and insulating films interposed between conductive films are formed on a semiconductor substrate. The multi-layer structure is very thick and high with a sharp angle at its corner. Therefore, a wiring especially of aluminum provided on the multi-layer structure is apt to break off at the corner. For avoiding this problem, in the prior art, a phosphosilicate glass (hereinafter referred to as PSG) film having a high phosphorus concentration of, e.g., 12 to 15 weight percent is formed by chemical vapour deposition on the substrate such that it covers the multi-layer structure, and is subjected to a heat treatment at 950° C. to 1000° C. so that the upper surface of the PSG film becomes smooth above the corner. The aluminum wiring formed on the smooth upper surface of the PSG film is hardly broken off. However, another problem occurs in this method. Namely, when the semiconductor device is of the plastic package type, water is easily penetrated and the aluminum wiring is corroded by phosphoric acid which is produced by the water and phosphorus contained in a high concentration in the PSG film. If a PSG film having a low concentration of phosphorus is used, the corrosion problem is reduced. However, in this case, the upper surface thereof is not sufficiently smoothed by the heat treatment, and the above-mentioned break off problem of the wiring cannot be solved. Recently, a borophosphosilicate glass (hereinafter referred to as BPSG) film containing boron as well as phosphorus has been employed in place of the PSG film. The BPSG film is disclosed, for example, in "RCA Review" Vol. 43, September, 1982, pp. 423 to pp. 457, by Werner Kem and George L. Schnable. The BPSG film solves both of the break off problem and the corrosion problem mentioned above to a considerable extent.

However, the inventor of the present invention has discovered the following problem. The BPSG film is formed over a wiring layer or over the multi-layer structure and is subjected to the heat treatment to smooth the upper surface thereof, that is, to "reflow" the BPSG film for the purpose of protecting another wiring layer formed on the upper surface from being broken above the corner. A polycrystalline silicon layer is then formed on the BPSG film, and an impurity such as phosphorus or boron is diffused into the polycrystalline silicon layer. In this case, after the impurity diffusion step, wrinkles appear on the surface of the polycrystalline silicon layer. This phenomenon means that strains are produced in the polycrystalline silicon layer. This phenomenon must be avoided because the wiring or electrode pattern to be formed by the polycrystalline silicon layer may be otherwise partially moved in the subsequent process step of the device such as a thermal step. Moreover, precise patterning of the polycrystalline layer becomes impossible because the etching speed of the layer may be changed at the portions where the wrinkles exist.

SUMMARY OF THE INVENTION

Accordingly, it is one object of the present invention to provide an improved semiconductor device which is free from the breaking off of the upper wiring layer and the corrosion problem of the aluminum wiring layer.

Another object of the present invention is to provide a novel process of manufacturing the claimed improved semiconductor device.

According to one feature of the present invention, there is provided a semiconductor device comprising a semiconductor substrate, a insulating film formed on a major surface of the semiconductor substrate, a conductive layer shaped in a predetermined pattern and provided on the insulating film, a BPSG film covering the conductive layer and the insulating film, a PSG film having a low phosphorus concentration and provided on the BPSG film, and a polycrystalline silicon layer doped with an impurity and provided on the PSG film. To reflow the BPSG film easily and to avoid the corrosion of the aluminum which may be directly formed on the BPSG film, it is favorable that the BPSG film contains phosphorus of 4 to 8 weight percent, and boron of 2 to 12 weight percent. The PSG film contains favorably phosphorus of 2 to 6 weight percent and has favorably a thickness of 1000 to 3000 angstrons (Å). The upper limit of phosphorus concentration in the PSG film is defined for avoiding the corrosion problem of the aluminum wiring layer which may be directly formed on the PSG film. The lower limits of phosphorus concentration and the thickness of the PSG film are determined by many experiments in which the above-mentioned wrinkles are effectively eliminated from the surface of the polycrystalline silicon layer provided on the PSG film. The upper limit of the thickness of the PSG film is defined by the practical use in view of easiness of making a contact hole therein, or patterning it. The conductive layer may be a gate electrode of a insulated gate type field effect transistor or a wiring layer of another element. The material thereof may be polycrystalline silicon, aluminium, molybdenum, silicides, or the like. Further the doped polycrystalline silicon layer may be a wiring layer extending on the PSG film, or a part of an electrode connected to an impurity region in the substrate through a contact hole formed in the PSG film and the BPSG film. According to another aspect of the present invention, there is provided a method of manufacturing a semiconductor device comprising the steps of preparing a semiconductor substrate with an impurity region of a circuit element therein, forming a first insulating film on a major surface of the substrate, forming a wiring layer on the first insulating film, depositing a BPSG film on the substrate so as to cover the wiring layer and the first insulating film, subjecting a heat treatment at temperature between 700° C. to 1000° C. so as to reflow the BPSG film, depositing a PSG film having a low phsophorus concentration on the BPSG film, forming a contact hole in the PSG film, the BPSG film and the first insulating film to expose a surface portion of the impurity region, forming a semiconductor film on the PSG film so as to contact an exposed surface portion of the impurity region, through the contact hole, and diffusing an impurity of the same conductivity type as the impurity region into the semiconductor film. By this method, a stable and good ohmic contact structure may be constructed.

DESCRIPTION OF THE PRIOR ART

Figure 1A:
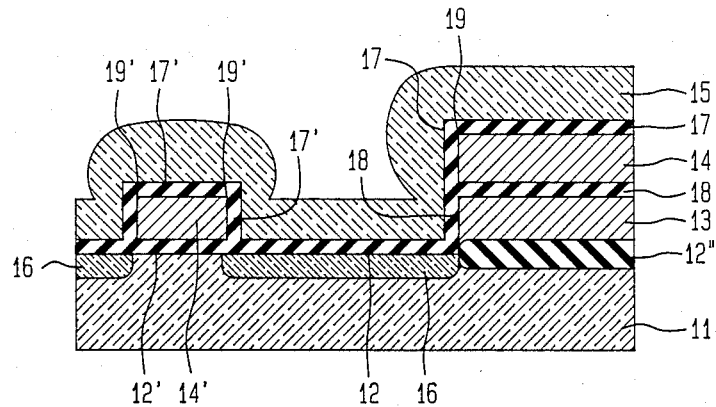
FIG. 1A and FIG. 1B are cross-sectional views partially showing successive steps of a manufacturing process of a semiconductor device in the prior art.
Figure 1B:
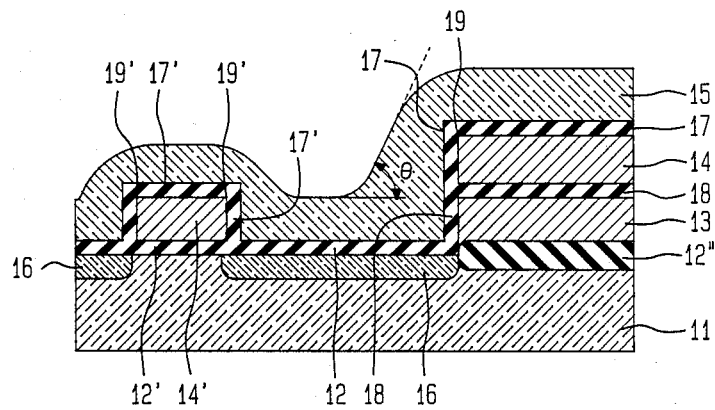

Referring to FIG. 1A, N-type source and drain regions 16 are formed in a major surface of P-type semiconductor substrate 11. An insulating film 12 including a ate insulating film 12' and a field insulating film 12" is formed on the major surface of the substrate. A gate electrode 14' of polycrystalline silicon is formed on the gate insulating film 12', enveloped by a thermal oxide film 17' and having corners 19' of sharp angles. Also, a multi-layer construction having a large height and a sharp corner 19 is formed on the field insulating film 12". More particularly, the multi-layer construction is composed of a lower wiring layer 13 of polycrystalline silicon on the field insulating film 12", a first thermal silicon oxide film 18 on the upper and side surfaces of the lower wiring layer 13, an upper wiring layer 14 of polycrystalline silicon on the first thermal silicon oxide film 18, and a second silicon oxide film 17 on the upper and side surfaces of the upper wiring layer 14. A PSG film 15 containing phosphorus of 12 weight percent and having 1.5 μm in thickness is deposited by chemical vapour deposition over the substrate such that it covers the gate electrode structure and the multi-layer structure. Next, a thermal treatment of 30 minutes is conducted under a condition of steam atmosphere and 950 centigrade degrees. By the thermal treatment, the surface of the PSG film 15 becomes smooth as shown in FIG. 1B. More particularly, the angle $\theta$ of the film 15 becomes about 25 degrees. Therefore, even if an aluminum wiring layer (not shown) is provided on the PSG film 15, the wiring layer is hardly broken. However, the PSG film 15 contains a large amount of phosphorus, such as 12 weight percent, and therefore the aluminum is easily corroded by invaded water as mentioned above.

DESCRIPTION OF THE EMBODIMENT

Figure 2A:
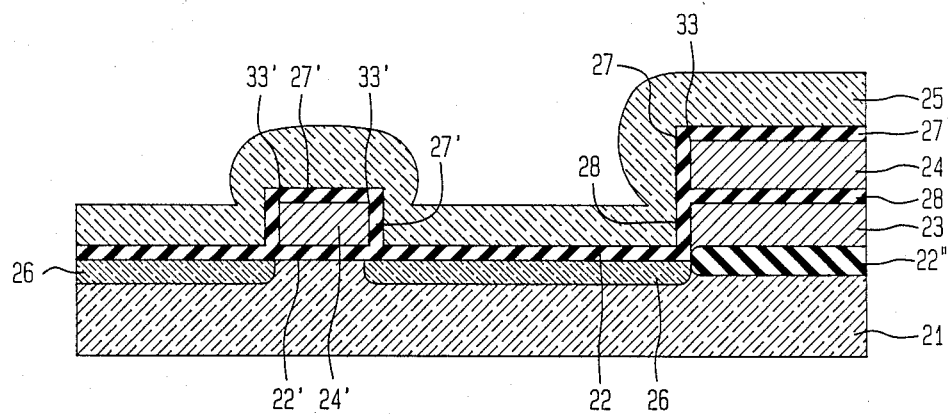
FIG. 2A to FIG. 2D are cross-sectional views partially showing successive steps of a manufacturing process of a memory device according to an embodiment of the present invention.
Figure 2B:
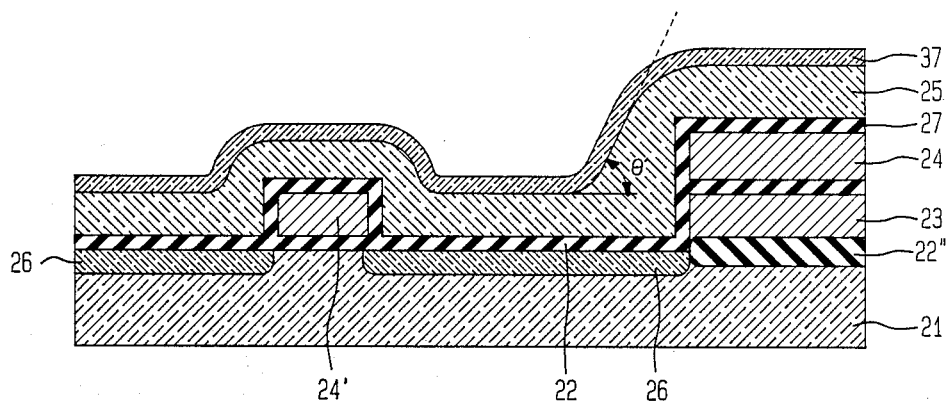

Referring to FIG. 2A, N-type source and drain regions 26 are formed in a major surface of P-type semiconductor substrate 21. An insulating film 22 including a gate insulating film 22' and a field insulating film 22" is formed on the major surface of the substrate. A gate electrode 24' of a second level polycrystalline silicon is formed on the gate insulating film 22', enveloped by a thermal oxide film 27' and having corners 33' of sharp angles. Also, a multi-layer construction having a large height and a sharp corner 33 is formed on the field insulating film 22". More particularly, the multi-layer construction is composed of a lower wiring layer 23 of a first level polycrystalline silicon, a first thermal oxide film 28 on the upper and side surfaces of the lower wiring layer 23, an upper wiring layer 24 of the second level polycrystalline silicon on the first thermal silicon oxide film 28, and a second silicon oxide film 27 on the upper and side surfaces of the upper wiring layer 24. A BPSG film 25 containing phosphorus of 5 weight percent and boron of 5 weight percent and having 0.5 μm in thickness is deposited by a reaction of a mixture of gasses consisting of phosphine ($PH_3$), diborane ($B_2H_6$), silane ($SiH_4$) and oxygen ($O_2$). Next, a heat treatment of 30 minutes at 850 centigrade degrees under steam atmosphere is conducted so that the surface of the BPSG, film 25 is flattened and the angle $\theta$ in FIG. 2B becomes about 25 degrees.

Figure 2C:
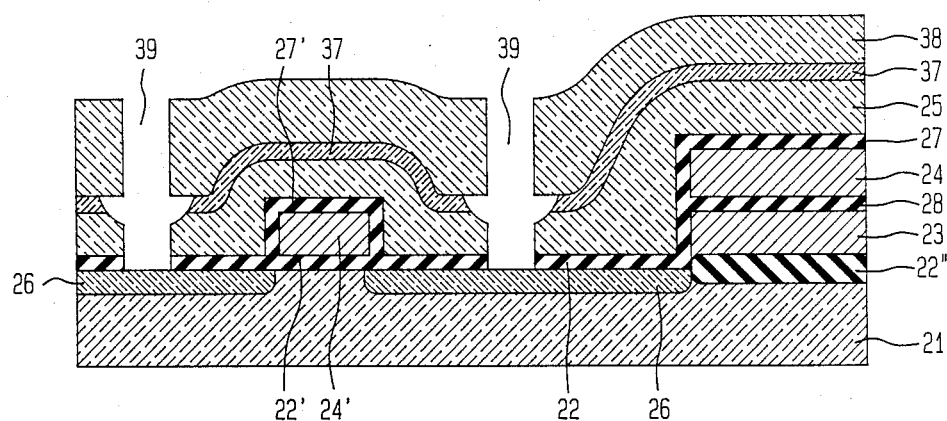
Figure 2D:
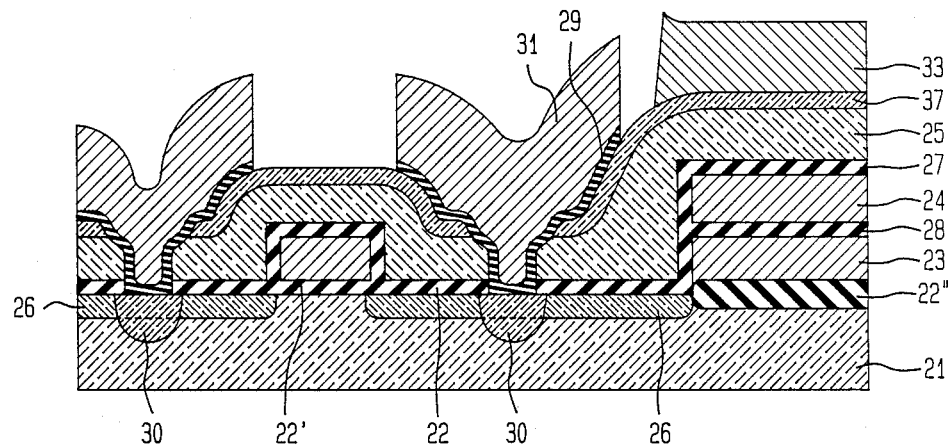

Thereafter, a PSG film 37 of 0.15 μm in thickness and containing phosphorus of 4 weight percent is formed on the BPSG film 25 by a reaction of a mixture of gasses consisting of $PH_3$, $SiH_4$ and $O_2$. Next, as shown in FIG. 2C, contact holes 39 are formed by reactive ion etching method in the PSG film 37 and the BPSG film 25 by using a photoresist film 38 as a mask. Then, as shown in FIG. 2D, after removing the photoresist film 38, a thin polycrystalline silicon film 29 of 2000 Å thickness is deposited on the PSG film 37 and in each contact hole 39. Thereafter, phosphorus is diffused into the silicon film in a conventional method, and high impurity N-type regions 30 are formed in source and drain region 26 by introducing phosphorus through the silicon film 29. After an aluminum layer is deposited on the silicon film and patterning is conducted on the aluminum layer and silicon film, source, drain electrode wiring including the doped polycrystalline silicon film 29 and the aluminum layer 31 is formed in each contact hole 39 and on a part of the PSG film 37 in the vicinity of the contact hole 39. Moreover, another wiring layer 33 of aluminum may be formed on the PSG film 37. In the semiconductor device according to the present invention, there is no failure in the aluminum wiring layer on the PSG film. Movever, when PCT (pressure cooker test) has been conducted on the semiconductor device under a condition of 2.3 atmos pressure and 125 centigrade degrees, it has been ascertained that the device according to the present invention has a good antimoisture characteristic because under the PCT beyond 300 hours, the accumulated failure ratio has been zero. Further, in the embodiment mentioned above, the BPSG film is formed by the reaction of the mixture gasses including $B_2H_6$. However, the BPSG film may be formed by injecting boron ion ($B^+$) into a PSG film by ion implantation method. For example, to form the BPSG film, a PSG film may be subjected to the ion implantation of boron ion at a amount of $10^{14}$ to $10^{16}$ ions/cm$^2$ with 150 keV energy.

What is claimed is:

1. A semiconductor device comprising a semiconductor substrate of one conductivity type, source and drain regions of an opposite conductivity type formed in a major surface of said substrate by interposing a channel region therebetween, a first insulating film formed on said major surface of said substrate covering said channel region and said source and drain regions, a gate electrode formed on said first insulating film above said channel region, a second insulating film covering said gate electrode, a borophosphosilicate glass film of a first thickness formed on said first and second insulating films such that it covers over said gate electrode and said source and drain regions, a phosphosilicate glass film of a second thickness less than said first thickness having a low phosphorus concentration and formed on said borophosphosilicate glass film, at least one contact hole provided in said phosphosilicate glass film, in said borophosphosilicate glass film and in said first insulating film to expose at least one of said source and drain regions, a polycrystalline silicon layer doped with an impurity of said opposite conductivity type and formed in said contact hole, said polycrystalline silicon layer being contacted with the exposed surface of one of said source and drain regions and extending onto said phosphosilicate glass film, said borophosphosilicate glass film containing phosphorus of from about 4 to about 8 weight percent and boron of from about 2 to about 12 weight percent, and said phosphosilicate glass film containing phosphorus of from about 2 to about 12 weight percent and having a thickness of from about 1000 to about 3000 angstroms.

2. A semiconductor device comprising a semiconductor substrate of one conductivity type, an impurity region of the opposite conductivity type formed in a major surface of said substrate, a first insulating film formed on a major surface of said substrate including said impurity region and having an opening exposing a part of said impurity region, a conductive layer shaped in a predetermined pattern and provided on a portion of said first insulating film, a second insulating film covering said conductive layer, a borophosphosilicate glass film formed on said second insulating film an on another portion of said first insulating film on which said conductive layer is absent, a phosphosilicate glass film having a low phosphorus concentration and formed on said borophosphosilicate glass film, and a polycrystalline silicon layer doped with an impurity of said opposite conductivity type and formed on said phosphosilicate glass film, said polycrystalline silicon layer contacting said impurity region through said opening, said phosphosilicate glass film being relatively thinner than said borophosphosiicate glass film and the thickness of said phosphosilicate glass film ranging from about 1000 to about 3000 angstroms.

3. A semiconductor device of claim 2, in which said borophosphosilicate glass film contains phosphorus of 4 to 8 weight percent, and boron of 2 to 12 weight percent.

4. A semiconductor device of claim 2, in which said phosphosilicate glass film contains phosphorus in 2 to 12 weight percent and has a thickness of 1000 to 3000 angstroms.

5. A semiconductor device comprising a semiconductor substrate of one conductivity type, source and drain regions of the opposite conductivity type formed in a major surface of said substrate and separated from each other, a gate insulator film formed on said major surface of said substrate between said source and drain regions, a gate electrode of polycrystalline silicon formed on said gate insulator film, a field insulating layer formed on said major surface of said substrate, a multi-layer structure including a first wiring layer and a second wiring layer superimposed on said first wiring layer via a first insulating film, said multi-layer structure being formed on said field insulating layer, a second insulating film covering said multi-layer structure, said source and drain regions and said gate electrode, a borophosphosilicate glass film formed on said second insulating film, a phosphosilicate glass film formed on said borophosphosilicate glass film, at least one contact hole provided in said phosphosilicate glass film, in said borophosphosilicate glass film and in said second insulating film to expose a portion of one of said source and drain regions, and a polycrystalline silicon layer doped with an impurity of said opposite conductivity type and formed in said contact hole, said polycrystalline silicon layer being contacted with the exposed surface of said portion of said one of said source and drain regions and extending on said phosphosilicate glass film, said borophosphosilicate glass film containing phosphorus of from about 4 to about 8 weight percent and boron of from about 2 to about 12 weight percent, and said phosphosilicate glass film containing phosphorus of from about 2 to about 12 weight percent and having a thickness thinner than the thickness of said borophosphosilicate glass film.

6. A semiconductor device comprising a semiconductor substrate, an impurity region formed in a major surface of said substrate, a first insulating film formed on said major surface of said substrate, a first conductor layer shaped in a predetermined pattern and provided on a first part of said first insulating film, a second insulating film formed on said first conductor layer, a second conductor layer formed on said second insulating film above said first part of said first insulating film, a third insulating film formed on said second conductor layer, a borophosphosilicate glass film provided on said third insulating film and on a second part of said first insulating film, a phosphosilicate glass film formed on said borophosphosilicate glass film, and a polycrystalline silicon film formed on said phosphosilicate glass film above said second part of said first insulating film and contacting said impurity region, said borophosphosilicate glass film containing phosphorus of from about 4 to about 8 weight percent and boron of from about 2 to about 12 weight percent, and said phosphosilicate glass film containing phosphorus of from about 2 to about 12 weight percent and having a thickness of from about 1000 to about 3000 angstroms.

* * * * *